United States Patent [19]
Shim et al.

[11] Patent Number: 6,139,760
[45] Date of Patent: Oct. 31, 2000

[54] SHORT-WAVELENGTH OPTOELECTRONIC DEVICE INCLUDING FIELD EMISSION DEVICE AND ITS FABRICATING METHOD

[75] Inventors: Kyu Hwan Shim; Sung Woo Choi; Mun Cheol Baek; Kyoung Ik Cho, all of Daejeon; Hae Gwon Lee, Chungcheongnam-Do, all of Rep. of Korea

[73] Assignee: Electronics and Telecommunications Research Institute, Daejeon, Rep. of Korea

[21] Appl. No.: 09/129,880

[22] Filed: Aug. 6, 1998

[30] Foreign Application Priority Data

Dec. 19, 1997 [KR] Rep. of Korea ..................... 97-70316

[51] Int. Cl.$^7$ ............................ B29D 11/00; H01L 21/00
[52] U.S. Cl. ............................... 216/24; 216/25; 313/309
[58] Field of Search ..................... 216/24, 25; 313/309

[56] References Cited

U.S. PATENT DOCUMENTS

| | | |
|---|---|---|
| 4,382,837 | 5/1983 | Rutz . |
| 5,385,862 | 1/1995 | Moustakas . |
| 5,578,225 | 11/1996 | Chien ........................................ 216/24 |
| 5,723,052 | 3/1998 | Liu ............................................ 216/25 |
| 5,772,904 | 6/1998 | Kim ........................................... 216/24 |

OTHER PUBLICATIONS

John A. Edmond et al., "Blue LEDs, UV photodiodes and high–temperature rectifiers in 6H–SiC", 1993–Elsevier Sciences Publishers B.V., pp. 453–460.

Ivor Brodie et al., "Vacuum Microelectronic Devices", Proceedings of the IEEE, vol. 82, No. 7, Jul. 1994, pp. 1006–1034.

*Primary Examiner*—Randy Gulakowski
*Assistant Examiner*—Shamim Ahmed
*Attorney, Agent, or Firm*—Jacobson, Price, Holman & Stern, PLLC

[57] ABSTRACT

Provided with a method of fabricating a 200–250 nm short-wavelength optoelectronic device, which has a combination of an optical device with a plurality of acceleration electrodes and a field emission device with a plurality of acceleration electrodes, from a semiconductor having a 5–6 eV energe band gap, based on a principle that an electron-hole pair is produced using a highly energetic electron which is injected from a field emission device, and short-wavelength photons are emitted when the electron recombines with the hole and confined in a quantum well to emit a light corresponding to the energy level of the quantum well, thereby eliminating the need of using dopants for forming n-p junctions in the semiconductor and achieving high efficiency in terms of energy because highly energetic electrons result in one or more electron-hole pairs.

13 Claims, 3 Drawing Sheets

SHORT-WAVELENGTH OPTOELECTRONIC DEVICE INCLUDING FIELD EMISSION DEVICE AND ITS FABRICATING METHOD

BACKGROUND OF THE INVENTION

1. Field of the Invention

The present invention relates to a short-wavelength optoelectronic device having the combination of a field emission device and an optical device, and its fabricating method.

2. Description of the Prior Art

Short-wavelength lasers are used in a variety of applications such as optical recording medium for display with enhanced record density, medical appliances, and measuring instruments. In particular, a use of short-wavelength laser makes it possible to enhance the optical record density several scores of times as high as the current density of several giga bytes such that the capacity of data communication device such as multimedia information server can be greatly increased. However, ultraviolet lasers employing He—Cd gas plasma or frequency modulation method are inapplicable to the microelectronics because they are extremely large in volume and very expensive.

On the contrary, many studies and developments have been vigorously made on the WBG (Wirde Band Gap) compound semiconductors such as SiC, AlN, GaN, ZnSe and the like for a purpose of applications in recent years. 400–500 nm blue LEDs (Light-Emitting Devices) have been put into practice use since 1994, and a recent report discloses a laser diode which operates for more than 1000 hours.

However, it is still difficult to fabricate an optoelectronic device using a semiconductor which operates in a short-wavelength band below 400 nm, and notably, there has never been reported on an ultraviolet laser diode formed from a semiconductor.

Especially, semiconductor optoelectronic device that operates in a short-wavelength band cannot be realized with some reasons, the fundamental reason of which resides in that electric resistance and ohmic junction resistance are extremely large to inject carriers, that is, mobile electrons or holes.

SUMMARY OF THE INVENTION

Accordingly, an object of the present invention is to provide an optoelectronic device and its fabricating method, wherein a short-wavelength optoelectronic device is formed from a wide band gap material by a cathodoluminescence in which a highly energetic electron beam is injected to create electron-hole pairs and photons are produced by electron-hole recombination, instead of injecting current-flowing minority carriers into a p-n junction.

In an aspect of the present invention, an optoelectronic device, which has a junction of an optical device and a field emission device array and emits ultraviolet wavelength and short-wavelength waves, includes: a buffer layer, a wave guide layer, a quantum well layer, and a Bragg diffraction superlattice layer sequentially deposited in a laminated form on the surface of an optoelectronic device substrate; an insulating layer, a second focusing electrode, a high-voltage insulating layer, and a second acceleration electrode sequentially formed on the lower surface of the substrate; a via hole formed in the lower surface of the substrate by etching the insulating layer, the second focusing electrode, the high-voltage insulating layer, the second acceleration electrode, and the substrate in a predetermined area; a light reflection layer formed on the bottom surface of the via hole; an optical device having an anode metal layer formed on a mesa structure, wherein the Bragg diffraction superlattice layer, the quantum well layer, and the wave guide layer on the substrate are etched in the form of the mesa structure; and a plurality of cathode tips formed on a field emission device substrate, and a field emission device array having an opening surrounding the cathode tips with a predetermined gap and including an insulating layer, a grid metal electrode, an insulating layer, a first acceleration electrode, a high-voltage insulating layer, and a first focusing electrode sequentially formed on the substrate; the optical device and the field emission device array being separated at a predetermined interval from each other and combined by support pillars.

BRIEF DESCRIPTION OF THE ATTACHED DRAWINGS

DETAILED DESCRIPTION OF PREFERRED EMBODIMENT

Hereinafter, the present invention will be described in detail with reference to the attached drawings.

This invention is directed to a method of fabricating a 200–400 nm short-wavelength optoelectronic device from a semiconductor having a 5–6 eV energe band gap, and based on a principle that an electron-hole pair is produced using a highly energetic electron which is injected from a field emission device, and a photon is emitted when the electron recombines with the hole. The optoelectronic device is provided with a quantum well layer and a Bragg diffraction superlattice layer, and the quantum well layer is interposed between the superlattice layer and a light reflection layer underlying the superlattice layer. Electrons and holes are confined in the quantum well layer for a concentrated recombination, as a result of which it is possible to maximally enhance the efficiency in producing electron-hole pairs from the electron beam and concentrate the photons at a single energy level.

Electrons are emitted from a field emission device array and accelerated with a high energy by an electron acceleration electrode. These electrons are injected into a WBG (Wide Energy Band Gap) material such as semiconductor including SiC, AlN, GaN, ZnSn, or a their mixture, producing electron-hole pairs. Then, photons generated through a cathodoluminescence are captured in a confined area of the optoelectronic device which has a quantum well layer, a Bragg diffraction layer, and a light reflection layer. This induces a stimulation of electron-hole pairs and an oscillation of photons, thereby realizing a directional light-emitting property. This method is very useful in fabricating a short-wavelength optielectronic device, e.g., light-emitting diode or laser diode, for emitting photons of a short wavelength (or high energy) with a WBG compound semiconductor that has a difficulty in forming a p-n or ohmic junction.

An emission of electrons is caused by a tunneling effect resulting from a voltage difference between a cathode tip and a grid in the field emission device array.

The efficiency of electron emission chiefly depends upon the work function of a cathode, the radius of a tip, a voltage difference between tip and grid, and so on. Electrons are accelerated with a high energy of several kilovolts by first and second acceleration electrodes, and injected into the optoelectronic device, thereby producing electron-hole pairs.

The optoelectronic device enhances the efficiency of light emission by confining the electron-hole pairs in a small area.

FIG. 1 is a cross-sectional view schematically illustrating a process for fabricating a surface emission optoelectronic device of the present invention.

Figure 1A:
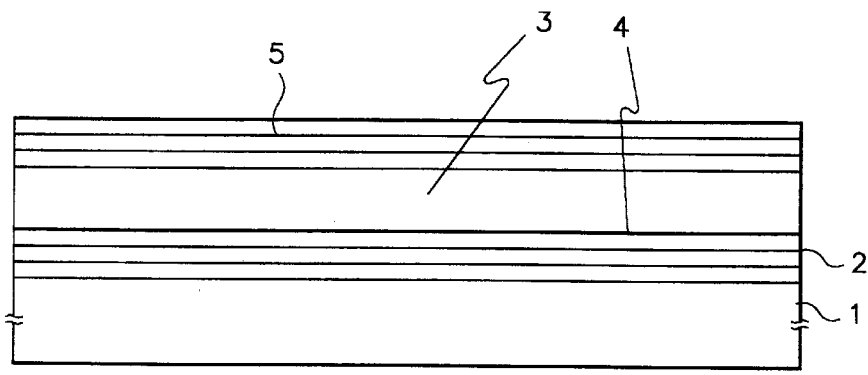
FIG. 1 is a cross-sectional view illustrating a process for fabricating a surface emission optoelectronic device in accordance with the present invention.

Referring to FIG. 1a, a super lattice buffer layer 2 is grown in the form of super lattice such as $(SiC)_X(GaN)_{1-X}$ or $(AlN)_X(GaN)_{1-X}$ on a substrate 1 consistng of silicon carbon (SiC), gallium arsenide (GaAs) or sapphire at a low temperature ranging from 400° C. to 800° C. in order to minimize a possible interfatial defect. The super lattice layer of $(SiC)_X(GaN)_{1-X}$ or $(AlN)_X(GaN)_{1-X}$ reduces a stress caused by a difference in the lattice constant, and minimizes defect density in the epitaxial layers formed on the super lattice layer by mitigating defect propagation from the interface to the upper layer.

The epitaxial layers, which serve as an anode, are doped with n-type or p-type impurity such as Zn, Mg, Be, S, Se, Te in the group II or VI at the same time they are growing, in order to make the current flow easily without pause. A wave guide layer 3 and a quantum well layer 4 are separately grown by regulating a mole fraction "x" in $(SiC)_X(GaN)_{1-X}$ or $(AlN)_X(GaN)_{1-X}$. Next, a Bragg diffraction superlattice layer 5 of $(SiC)_X(GaN)_{1-X}$ or $(AlN)_X(GaN)_{1-X}$ that satisfies requirements for Bragg diffraction is formed on the wave guide layer 3 and the quantum well layer 4.

A difference in the lattice constant between SiC and AlN is so insignificant that a defect caused by strain is usually negligible. Since, SiC has an indirect transition energy band structure, the mole fraction "x" of SiC must be small enough to maintain a direct transition energy band structure, thereby enhancing a quantum efficiency.

Conversely, although AlN and GaN are different in the lattice constant by 2% and both of them have a direct transition energy band structure, the mole fraction "x" must be regulated to be less than about 0.2 in order to form epitaxial layers of good quality without a defect.

The epitaxial layers having a single-crystal heterostructure may be formed using a method of growing a thin layer, such as molecular beam epitaxy or metal organic chemical vapor deposition.

Molecular beam epitaxy is very useful in growing a thin layer such as superlattice film and multicomponent film. It is a sophisticated technique in which a nitrogen gas is decomposed into plasma to provide very reactive nitrogen radicals in the atomic form. The amount of nitrogen gas flow is controlled in the range 1 to 10 sccm, holding the chamber in a ultrahigh vacuum between $10^{-4}$ and $10^{-5}$ torr while films are growing. Nitrogen gas plasma is prepared from PBN (pyrolitic boron nitride), and a gas inlet is disposed apart from a high-frequency induction coil in order to inject impurity in a small amount.

In the technique, the high frequency is usually 13.56 MHz and the electric power is 300 to 600 W, in which range the nitrogen gas can be sufficiently decomposed. A thin layer that is excellent in the electric conductivity and stable at high temperature is interposed between the high frequency coil and the PBN lest that a high electric field should be concentrated in a local region and thereby cause damages on the PBN when the high frequency is not matched in production of plasma.

Further, a nozzle of around 2 mm in diameter and a deflection electrode are provided at the end of the plasma chamber so as to deflect or accelerate/deccelerate a flow of nitrogen ions for an effective and easy control of the function of ions when growing a sample. Silicon and carbon are obtained from a solid or gaseous source such as Si, $SiH_4$, pyrolitic graphite, $C_3H_8$, $C_2H_4$, and so forth.

The buffer layer 2 is formed using a 20–50 eV ion beam at a low temperature in order to lower surface migration, whereby surface roughness can be reduced with enhanced smoothness. In an optoelectronic aspect, the active layer and the quantum well layer are formed under conditions that the ion energy is less than 15 eV, the temperature of a substrate is raised up to above 750° C., and the neutron/ion ratio is controlled less than $10^{-2}$, with a view to minimizing damages from the plasma ions.

Bragg diffraction superlattice layer 5 is designed to satisfy the Bragg diffraction requirements according to the wavelength of photons corresponding to a carrier recombination that takes place in the quantum well layer 4, and the mole fraction x is in the 0.1 to 0.2 range of value in order to maintain crystal properties against phase separation.

When forming a SiC—AlN superlattice in the super lattice layer whose cycle is $\lambda/4$, the wavelength $\lambda$ is determined to be a value corresponding to the energy of the quantum well layer. Further, the quantum well layer is positioned as deep as half the depth to which electrons penetrate, enhancing the efficiencies of production of electron-hole pairs and recombination of electrons and holes to the maximum, and it has a thickness in the range 10 to 30 nm to form two or three quantized energy levels.

Figure 1B:
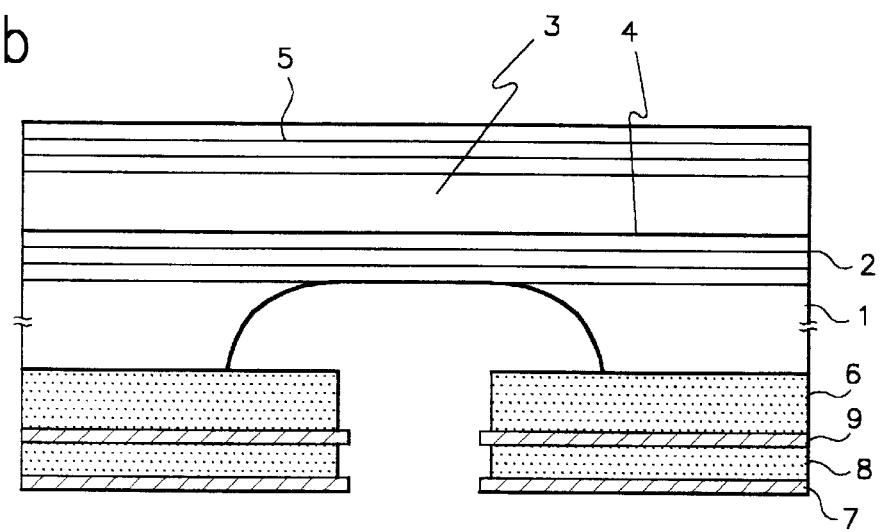

As shown in FIG. 1b, on the lower surface of the optoelectronic device substrate 1 are sequentially deposited an insulating layer 6, a metal coating for a second focusing electrode 9, a high-voltage insulating layer 8, and a metal coating for a second focusing electrode 7. A photoresist pattern (not shown) is formed, and an etching is carried out from the exposed metal coating to the lower surface of the buffer layer 2, forming a via hole 11. A second focusing electrode 9 is formed between the insulating layers 6 and 8 and another second focusing electrode 7 is on the high-voltage insulating layer 8. The electrodes 9 and 7 have a function as a second acceleration teminal for accelerating electrons, wherein the electron-accelerating electrode 7 and the electron-focusing electrode 9 form a pair.

The electrodes 9 and 7 are made from a metal that has a high melting point such as molybdenum (Mo), tantalum (Ta), and tungsten (W) and deposited to be approximately 0.4 $\mu$m thick by an e-beam or sputtering method.

The insulating layers 6 and 8 are formed by depositing a 1 $\mu$m thickness insulating material such as silicon oxide layer or silicon nitride layer at a temperature ranging from about 300° C. to about 500° C. using a PECVD (Plasma Enhanced Chemical Vapor Deposition) in which a mixed gas of $SiH_4$, $O_2$ and $NH_3$ is deposited at a high frequency or under an ECR (Electron Cyclotron Resonance plasma).

It should be noted that the high-voltage insulating layer 8 interposed between the acceleration electrode 7 and the focusing electrode 9 is a film of insulating material just like alumina ($Al_2O_3$) having a very high resistance to electric current and hot condition and deposited to have a thickness of about 0.2 to 0.4 $\mu$m. For the insulating layer and the metal electrode, use is made of a reactive mixed gas containing argon (Ar) gas as well as $CF_4$, $CCl_2F_2$, or $Cl_2$ and an ion-accelerating voltage which is applied by plasma potential for the purpose of an increase in the degree of physical etching is regulated up to above 200 V. The sample is held at below about 200° C. in order to prevent a photo-print film from being hardened or carbonized. Further, a carbon component remaining in an oxygen plasma is removed after the completion of an etching. The oxygen plasma in this case is under a pressure of 100–1000 mtorr and a high requency power of 100 W.

After the insulating layers 8 and 6 are selectively etched, an additional wet etching is performed using a mixed solution of HF, $NH_3OH$, $HNO_3$ and $H_2O_2$, eliminating the layer surface of several nanometers in thickness, in order to reduce a defect occurring under the superlattice buffer layer 2.

The reason that a two-stage acceleration electrode is used in the optoelectronic device resides in focusing the electrons with raised anode voltage to enhance production yield of electron-hole pairs. Since the maximum electric field that can be applied in a vacuum without plasma produced is approximately $2.5 \times 10^4$ V/cm, the acceleration electrode and the anode are designed to be positioned in such a way that the maximum accelerating voltage can be increased up to several kilovolts. The region in which a collision of electron produces a photon is dependent upon the energy of the elctron and corresponds to several hundreds of nanometers on the internal surface of the optoelectronic device which is to focus the electrons and generate electron-hole pairs. In such a region, the photons which have an energy level higher than that of a quantum well are reabsorbed by the quantum well layer 4 and emitted from it, thereby converted to photons of a single energy level.

Further, a light full reflection layer 10 is deposited on the bottom surface of the via hole 11 etched by photolithography and lift-off, so that it is possible to prevent the photons from escaping from the back surface of the substrate and make photons and carriers focused on a region of the active layer. The superlattice buffer layer 2 and the overlying semiconductor layers each of which functions as an anode are doped with an n-type impurity such as S, Si and Se, wherein the impurity concentration is greater than $10^{18}$ $cm^{-3}$ and thus the surface resistance falls below several hundreds of $\Omega/\square$.

A photolithography is performed to form a photoresist as a mask, exposing a window portion through which light is emitted from the optoelectronic device. Then, a reactive ion etching and an ion beam etching are used to remain the mesa-type active layer 12.

In the ion beam etching, the etching is performed at an angle between the optoelectronic device substrate 1 and the ion beam in the range 30° to 70° in such a manner that a window portion for light emission is formed in the mesa pattern. After a subsequent deposition of an anode metal film 13, the photoresist and the metal film on the laser active layer are eliminated by a lift-off.

Figure 1C:
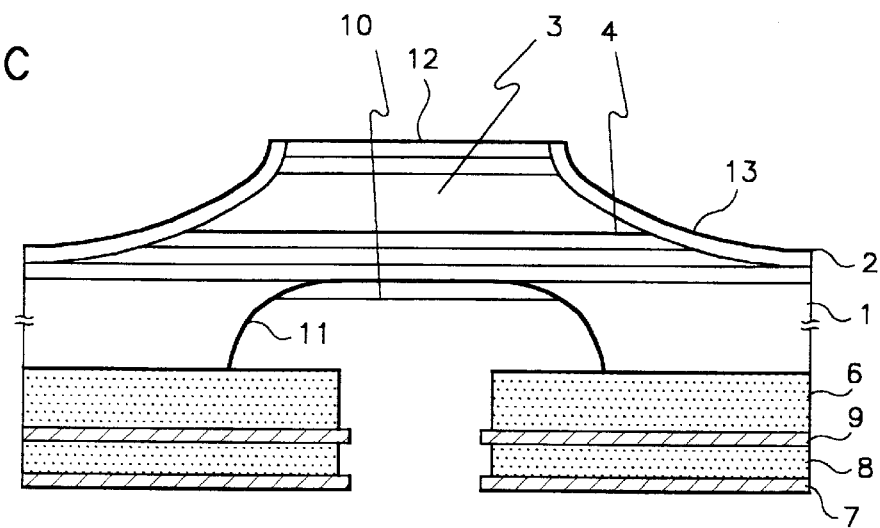

Lift-off is a technique used to produce a required metallization pattern by dipping a sample in a normal acetone solution and carrying out a subsequent ultrasonic wave treatment to remove all the metal layer, remaining the anode metal film 13, as illustrated in FIG. 1c.

There are further deposited an oxide layer consisting of MgO, $Al_2O_3$ or CaO, or a sodium chloride (NaCl) layer having a high energy gap of 8.8 eV as thick as more than several scores of microns such that the layer is brought in contact with a heat-proof plate that is excellent in thermal conduction so as to both eliminate the instability of device caused by different pressures and help a heat emission.

Figure 2A:
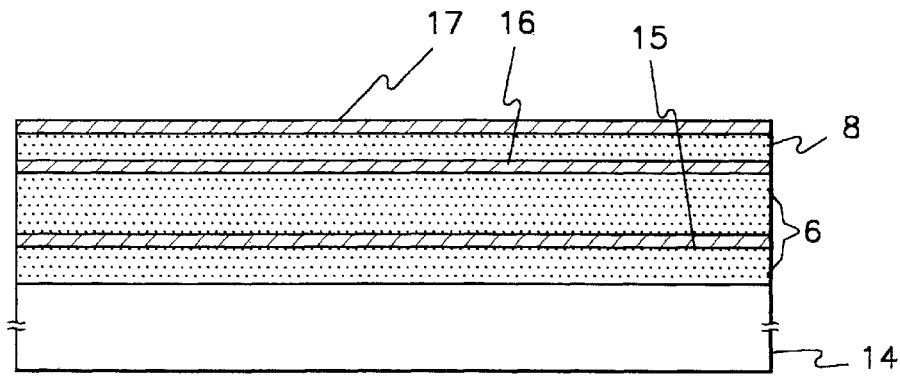
FIG. 2 is a cross-sectional view illustrating a process for fabricating a field emission device array in accordance with the present invention.
Figure 2B:
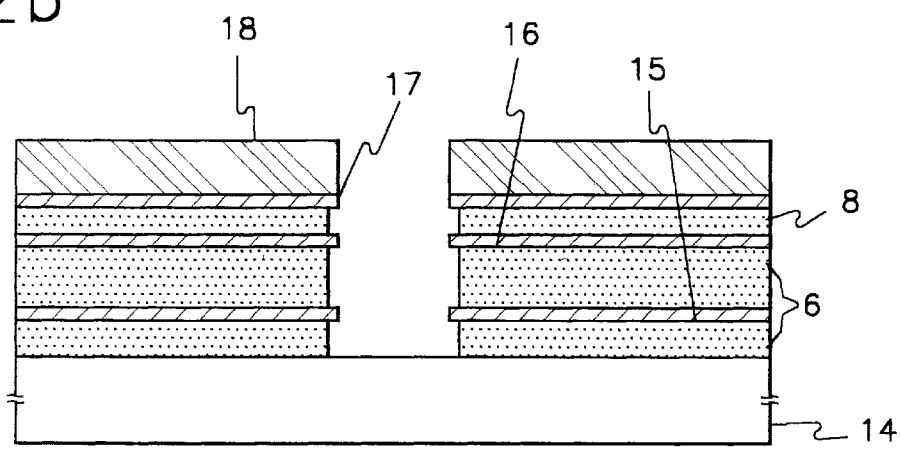
Figure 2C:
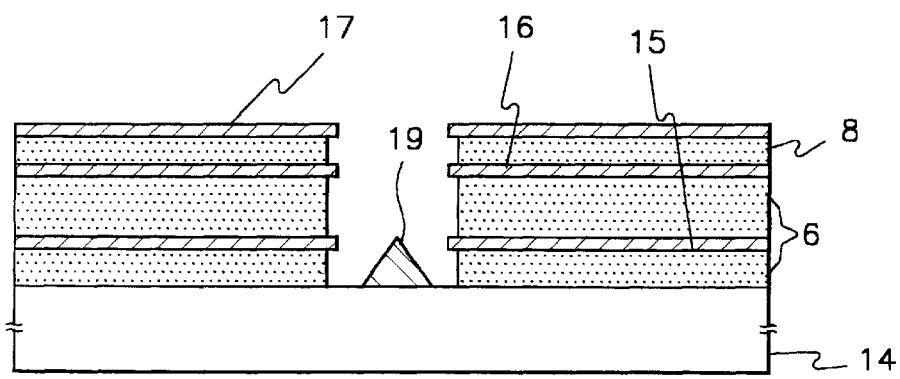

FIGS. 2a–2c are cross-sectional views illustrating a process for fabricating a field emission device array in accordance with the present invention.

Hereinafter, a method of fabricating a field emission device array of the present invention will be described with reference to FIGS. 2a–2c.

As shown in FIG. 2a, an insulating layer 6 consisting of silicon oxide, silicon nitride or alumina ($Al_2O_3$) is deposited on a field emission device substrate 14 and a metal film 15 is formed on the insulating layer 6 by PECVD (Plasma Enchanced Chemical Vapor Deposition), suttering, or e-beam evaporation technique. On the metal film 15 are sequentially deposited an insulating layer 6, an electrode metal film 16, a high-voltage insulating film 17, and an electrode metal film 17. Herein, the field emission device substrate 14 is a silicon wafer or a gallium arsenide or metal plate which is excellent in electric and thermal conduction. The electrode metal films 16 and 17 interposed between the insulating layers 6 and 8 are formed from a metal having a high melting point such as Mo, Ta, W or the like and function as a grid for extracting electrons, a first acceleratoin electrode and a lens for focusing the electrons.

As shown in FIG. 2b, after sequential depositions of the insulating layers 6 and 8, and metal films 15, 16 and 17, a photoresist pattern 18 is formed on the metal film 17, and thus exposed metal films 17, 16 and 15 and insulating layers 8 and 6 are etched in the order of lamination, exposing the metal films 17 and 16 which serve as a grid and an acceleration electrode and forming an opening through which the surface of the field emission devie substrate 14 is exposed in a predetermined area.

As shown in FIG. 2c, a metal such as tungsten (W), molybdenum (Mo) or tantalum (Ta) is deposited with an electron beam to form a conical shape cathode tip 19 for field emission on the substrate 14. The photoresist pattern 18 and the overlying metal film are then removed.

When the metal films are deposited, the top portion of the conical shape cathode tip 19 must be sharp and uniform with a view to enhancing the efficiency of field emission. This can be achieved by depositing the metal films while the substrate 14 makes a rotation in a tilt position. The radius of the metal tip 19 is 20 nm and the diameter of a gate is approximately 1.5 µm.

Figure 3:
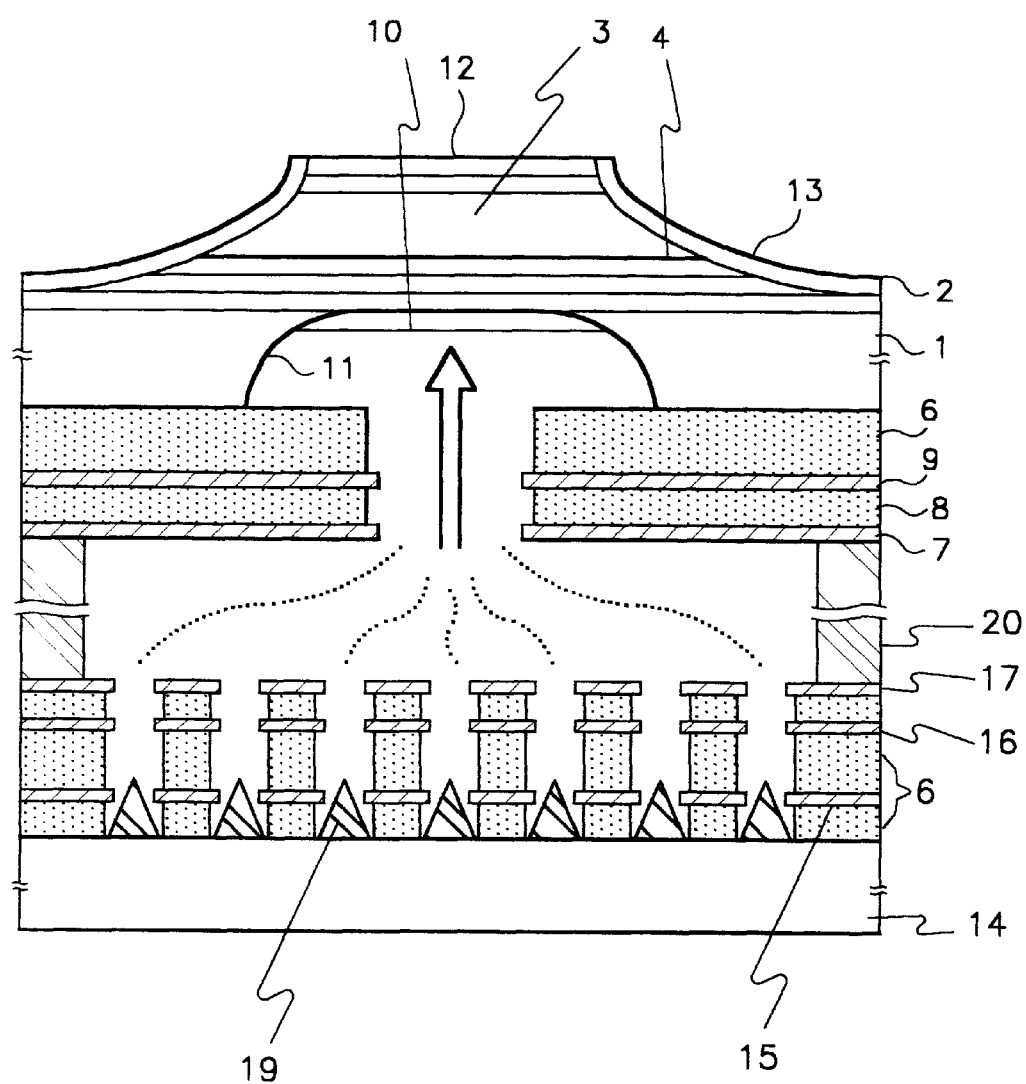
FIG. 3 is a cross-sectional view of a surface emission short-wavelength optoelectronic device in accordance with the present invention.

FIG. 3 is a cross-sectional view of a short-wavelength optoelectronic device including a field emission device and an optical device in accordance with the present invention.

As illustrated in FIG. 3, the optoelectronic device of the present invention is made in such a manner that the optical device and the field emission device respectively fabricated through the processes in FIGS. 1 and 2 are separated at a pedetermined distance from each other by support pillars 20 and adhesively combined.

An adhesive for combining the optical device and the field emission device array is silicate and the internal space is held in a hard vacuum less than $10^{-7}$ torr.

Prior to sealing the space in a hard vacuum, the combination of optical device and field emission device is held at a temperature in the range 200 to 400° C. for 30 minutes or more in order to reduce potential virtual leak to the minimum.

This makes the average free path longer and prevents a contamination with impurity and a deterioration of the tip. The height of the support pillars 20 is so regulated as to apply a voltage of several kilovolts between the first and second acceleration electrodes.

During the sealing step, the optical device and the electrodes of the field emission device array are arranged with accuracy within 5 μm. A high current density of 1 kA/cm² may be supplied from the surface of each cathode tip but the emitted current per a tip is too low to oscillate the laser device.

For this reason, the electron beam given off from the field emission device array of a wavelength which has several hundreds of tips integrated therein in the array form is accelerated and focused by the second acceleration electrode to maximize the number of electrons reaching the surface of the substrate 1 that functions as a cathode, thereby supplying a current density sufficient to operate a high-power optoelectronic device.

The insulating thin layer underlying the second acceleration electrode formed on the back surface of the optoelectronic device is regulated in its shaped and thickness that the electron beam should be properly focused on the via hole of the optical device in order to collect and supply all electrons emitted from an array of several scores or hundres of field emission devices to a single optoelectronic device.

In such a structure, the field emission device array includes a number of field emission devices which are separated at intervals of 1 to 5 μm from each other. In order to have the number of field emission tips per area to the maximum, the cathode tips are arranged in the beehive form. Where all the via holes are 5 μm in diameter, for example, the current of the electron beam may be increased up to approximately 200 times by integrating the field emission devices in an array in a circular area 100 μm in diameter.

As the current of an electron beam supplied from each cathode tip is $10^{-7}$ to $10^{-5}$ A, such a multi-tip structure can produce and accelerate a current of several kiloamperes per square centimeter (kA/cm²) into the optoelectronic devices. In a case where an accelerating voltage and an electron beam current is extremely high, it is possible to oscillate a laser by producing electron-hole pairs as many as above the threshold current which is the mimimum current required for a laser oscillation.

Furthermore, the voltage and current applied to the field emission device are controlled depending upon the luminescent characteristics of the optoelectronic device so as to prolong the life of the device.

Such as in the present invention, a method of realizing an ultraviolet optoelectronic device is provided, wherein there is no necessity for having a process such as doping or ohmic junction in order to form an n-p junction in the wide band gap compound semiconductor. The energy of an accelerated electron determines the peneatration depth of the electron and the production efficiency of electron-hole pairs, and one or more electron-hole pairs are produced from one electron. Accordingly, the intensity of light emitted can be controlled based on the accelerating voltage and the elctron beam current, and it is possible to provide an efficiency sufficient for display.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

What is claimed is:

1. A method of fabricating an optoelectronic device, which includes a junction of an optical device and a field emission device array and emits ultraviolet wavelength and short-wavelength waves, the method comprising the steps of:

sequentially depositing a superlattice buffer layer, a wave guide layer, a quantum well layer, and a Bragg diffraction superlattice layer on an optoelectronic device substrate;

sequentially depositing a first insulating layer, a first metal layer, a second insulating layer, and a second metal layer in a laminated form, forming a mask pattern on the second metal layer, sequentially etching the layers from the exposed second metal layer to the substrate, and forming a via hole exposing the surface of the superlattice buffer layer formed on the substrate;

forming a light reflection layer on the bottom surface of the via hole;

etching the Bragg diffraction layer, the quantum well layer, and the wave guide layer on the substrate to have a mesa structure, and depositing a cathode metal layer on the mesa structure to prepare an optical device;

sequentially depositing an insulating layer, a first metal layer, an insulating layer, a second metal layer, a high-voltage insulating layer, and a third metal layer in a laminated form on a field emission device substrate;

etching the first to third metal layers and insulating layers sequentially from the uppermost laminate by use of a photoresist pattern to form an opening exposing the surface of the field emission device substrate, and forming a grid metal, a first acceleration electrode, and a first focusing electrode on the substrate;

forming a cathode tip on the exposed substrate to prepare a field emission device array; and adhesively combining the optical device and the field emission device array being separated at a predetermined distance from each other by support pillars.

2. The method as defined in claim 1, wherein the cathode tip, and the first and second acceleration electrodes are formed from a metal having a high melting point.

3. The method as defined in claim 1, wherein the buffer layer is grown in the supperlattice form such as $(SiC)_X(GaN)_{1-X}$ or $(AlN)_X(GaN)_{1-X}$ at a low temperature in the range 400 to 800° C.

4. The method as defined in claim 1, wherein the wave guide layer, the quantum well layer, and the Bragg diffraction supperlattice layer are formed from $(SiC)_X(GaN)_{1-X}$ or $(AlN)_X(GaN)_{1-X}$ and doped with Zn, Mg, Be, S, Se, or Te in group II or VI as n-type or p-type impurity while they are growing, in order to make current flow easily without pause.

5. The method as defined in claim 4, wherein the wave guide layer and the quantum well layer are formed by regulating mole fraction "x" in $(SiC)_X(GaN)_{1-X}$ or $(AlN)_X(GaN)_{1-X}$.

6. The method as defined in claim 1, wherein the first and second acceleration electrodes are formed from a metal having a high melting point such as molybdenum (Mo), tantalum (Ta), or tungsten (W) in a thickness of approximately 0.4 μm by an e-beam or sputtering method.

7. The method as defined in claim 1, wherein the insulating layer is formed by depositing an insulating material such as a silicon oxide layer or a silicon nitride layer in a thickness of 1 μm at a temperature of about 300 to 500° C. by a plasma enhanced chemical vapor deposition for depositing a layer with a mixed gas of $SiH_4$, $O_2$ and $NH_3$ under a high frequency or ECR plasma.

8. The method as defined in claim 1, wherein the high-voltage insulating layer is formed from alumina ($Al_2O_3$) to have a thickness in the range 0.2 to 0.4 μm.

9. The method as defined in claim 1, wherein the insulating layer, the high-voltage insulating layer, and the first to third metal electrodes are formed using a reactive mixed gas of $CF_4$, $CCl_2F_2$ or $Cl_2$ containing argon (Ar) with an ion accelerating voltage applied to a plasma potential being controlled above 200 V in order to enhance a degree of physical etching; and after the completion of the etching step, an oxygen plasma is used at a pressure of 100 to 1000 mtorr and a high-frequency electric power of 50 to 100 W in order to remove a residual carbon component in the oxygen plasma.

10. The method as defined in claim 1, wherein the etching step for forming the mesa structure comprises performing a reactive ion etching and an ion beam etching, the ion beam etching being performed at an angle of 30 to 70 degrees between the substrate and the ion beam to form the mesa structure, thereby exposing a window portion through which a laser can be emitted.

11. The method as defined in claim 1, wherein the field emission device substrate uses a material excellent in electric and thermal conductions such as silicon wafer, sapphire, or gallium arsenide or metal plate.

12. The method as defined in claim 1, wherein the step of forming the cathode tip comprises depositing tungsten (W), molybdenum (Mo) or tantalum (Ta) with an electron beam to form a field-emitting metal tip in the cornical shape, depositing a metal layer with a sample turning at a tilt position in order to make the top portion of the cathode tip sharp and uniform and thereby enhance the efficiency of field emission, and controlling the radius of the metal tip below 20 nm and the diameter of a gate approximately 1.5 $\mu$m.

13. The method as defined in claim 1, wherein the step of combining the optical device and the field emission device array comprises using a silicate adhesive, sealing in a hard vacuum of below $10^{-7}$ torr, holding at a temperature in the range 200 to 400° C. for more than 30 minutes prior to sealing in a hard vacuum so as to reduce a potential virtual leak that may occur subsequently, and regulating the height of the support pillars so that a voltage of several hunderds of volts can be applied between the first and second acceleration electrodes.

* * * * *

UNITED STATES PATENT AND TRADEMARK OFFICE
CERTIFICATE OF CORRECTION

PATENT NO.    : 6,139,760
DATED         : October 31, 2000
INVENTOR(S)   : Kyu Hwan Shim et al.

It is certified that error appears in the above-identified patent and that said Letters Patent is hereby corrected as shown below:

<u>Title page,</u>
Item [54], states "SHORT-WAVELENGTH OPTOELECTRONIC DEVICE INCLUDING FIELD EMISSION DEVICE AND ITS FABRICATING METHOD".
It should state as -- SHORT-WAVELENGTH OPTOELECTRONIC DEVICE INCLUDING FIELD EMISSION DEVICE AND OPTICAL DEVICE AND ITS FABRICATING METHOD -- instead.

Signed and Sealed this

Second Day of April, 2002

*Attest:*

JAMES E. ROGAN
*Attesting Officer      Director of the United States Patent and Trademark Office*